United States Patent
Shang et al.

(10) Patent No.: US 7,387,925 B2
(45) Date of Patent: Jun. 17, 2008

(54) INTEGRATION OF STRAINED GE INTO ADVANCED CMOS TECHNOLOGY

(75) Inventors: Huiling Shang, Yorktown Heights, NY (US); Meikei Ieong, Wappingers Falls, NY (US); Jack Oon Chu, Manhasset, NY (US); Kathryn W. Guarini, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/799,261

(22) Filed: Apr. 10, 2007

(65) Prior Publication Data

US 2007/0218621 A1     Sep. 20, 2007

Related U.S. Application Data

(62) Division of application No. 10/876,155, filed on Jun. 24, 2004, now Pat. No. 7,244,958.

(51) Int. Cl.
*H01L 21/336* (2006.01)
(52) U.S. Cl. .................. 438/197; 257/E21.092
(58) Field of Classification Search .......... 257/E21.09, 257/E21.092, E21.102, E21.115
See application file for complete search history.

(56) References Cited

U.S. PATENT DOCUMENTS

| | | | |
|---|---|---|---|
| 5,534,713 A | 7/1996 | Ismail | 257/24 |
| 5,847,419 A | 12/1998 | Imai | 257/192 |
| 5,906,951 A | 5/1999 | Chu | 438/751 |
| 6,235,567 B1 | 5/2001 | Huang | 438/202 |
| 6,310,367 B1 | 10/2001 | Yagishita | 257/190 |
| 6,350,993 B1 | 2/2002 | Chu | 257/19 |
| 6,399,970 B2 | 6/2002 | Kubo | 257/194 |
| 6,633,066 B1 | 10/2003 | Bae | 257/347 |
| 6,649,492 B2 | 11/2003 | Chu | 438/478 |
| 6,730,551 B2 | 5/2004 | Lee | 438/191 |
| 6,995,430 B2 | 2/2006 | Langdo | 257/352 |
| 7,074,623 B2 | 7/2006 | Lochtefeld | 438/3 |
| 2002/0197803 A1 | 12/2002 | Leitz | 438/285 |
| 2003/0025131 A1 | 2/2003 | Lee | 257/200 |
| 2003/0030091 A1 | 2/2003 | Bulsara | 257/301 |
| 2003/0052334 A1 | 3/2003 | Lee | 257/200 |
| 2004/0178406 A1 | 9/2004 | Chu | 257/19 |

OTHER PUBLICATIONS

"Strained Ge channel p-type metal-oxide-semiconductor field-effect transistors grown on $Si_{1-x}Ge_x$/Si virtual substrates" M. L. Lee, et al. Appl. Phys. Lett., vol. 79, pp. 3344-3346, 2001.

*Primary Examiner*—Scott B. Geyer
(74) *Attorney, Agent, or Firm*—George Sai-Halasz; Robert M. Trepp

(57) ABSTRACT

A structure and method of fabrication for PFET devices in a compressively strained Ge layer is disclosed. The fabrication method of such devices is compatible with standard CMOS technology and it is fully scalable. The processing includes selective epitaxial depositions of an over 50% Ge content buffer layer, a pure Ge layer, and a SiGe top layer. Fabricated buried channel PMOS devices hosted in the compressively strained Ge layer show superior device characteristics relative to similar Si devices.

1 Claim, 5 Drawing Sheets ary of application Ser. No. 10/876,155, filed Jun. 24, 2004, now U.S. Pat. No. 7,244,958, which is incorporated herein by reference in its entirety.

INTEGRATION OF STRAINED GE INTO ADVANCED CMOS TECHNOLOGY

CROSS REFERENCE TO A RELATED APPLICATION

This application is a division of application Ser. No. 10/876,155, filed Jun. 24, 2004, now U.S. Pat. No. 7,244,958 which is incorporated herein by reference in its entirety.

FIELD OF THE INVENTION

The present invention relates to semiconductor technology and, more specifically, to a PMOS device hosted in strained Ge. This device is fabricated in a manner that it can be effectively scaled and integrated into high performance silicon based CMOS technologies.

BACKGROUND OF THE INVENTION

Today's integrated circuits include a vast number of devices. Smaller devices are key to enhance performance and to improve reliability. As MOSFET (Metal Oxide Semiconductor Field-Effect-Transistor, a name with historic connotations meaning in general an insulated gate Field-Effect-Transistor) devices are being scaled down, the technology becomes more complex and new methods are needed to maintain the expected performance enhancement from one generation of devices to the next.

One of the most important indicators of potential device performance is the carrier mobility. There is great difficulty in keeping carrier mobility high in devices of deeply submicron generations. A promising avenue toward better carrier mobility is to modify the semiconductor that serves as raw material for device fabrication. It has been known, and recently further studied, that tensilely or compressively straining semiconductors have intriguing carrier properties. In particular, a 90-95% improvement in the electron mobility has been achieved in a strained silicon (Si) channel NMOS as described in U.S. Pat. No. 6,649,492 B2 to J. O. Chu entitled "Strained Si Based Layer Made By UHV-CVD, and Devices Therein" incorporated herein by reference. Similarly for hole enhancement, compressively-strained buried germanium (Ge) MODFETs have yielded high hole mobilities as described by S. J. Koester, et. al. in "Extremely high transconductance Ge/Si$_{0.4}$Ge$_{0.6}$ p-MODFET's grown by UHV-CVD, " IEEE Elect. Dev. Lett. 21, 110 (2000), and in U.S. patent application "High Speed Ge-Channel SiGe/Ge/SiGe Heterostructure for Field Effect Transistor" by J. O. Chu, Ser. No. 09/936,320 filed Sep. 12, 2000, incorporated herein by reference. Combination of tensilely and compressively strained SiGe regions in the same wafer is described in U.S. patent application "Dual Strain-State SiGe Layers for Microelectronics" by J. O. Chu, Ser. No. 10/389,145, filed Mar. 15, 2003, incorporated herein by reference.

Because of its enhanced hole mobility there is renewed technological interest in Ge-based MOSFET devices for high performance CMOS logic. In particular, surface channel Ge MOSFET devices, using oxynitride (GeON) as the gate insulator, have been demonstrated by H. Shang et al, IEDM, p. 441, 2002. Or, using high-K as the gate insulator, Ge PMOS is described in the following references: C. Chui et al, IEDM, p. 437, 2002, C. H. Huang et al, VLSI symp. p. 119, 2003 and A. Ritenour et al, IEDM, p. 433, 2003 all three of which are incorporated herein by reference.

Buried channel strained Ge PMOS have also been reported having hole mobility enhancement as described in the following references of M. Lee et al, IEDM, p. 429 2003 and H. Shang et al, VLSI symp. 2004 both of which are incorporated herein by reference. Nonetheless, the Ge devices reported have employed simple device structures, such as ring type gate structure lay-out for simplified integration, and usually have relative large dimensions. Such features are not or suitable for integration into advanced high performance CMOS technologies.

A process compatible with standard CMOS technology, in order to incorporate strained Ge structures for enhanced hole mobility in PMOS devices, is not available.

SUMMARY OF THE INVENTION

This invention describes an integration scheme for advanced CMOS technology which incorporates a high mobility strained Ge buried channel structure, leading to PMOS device improvement. The scheme is readily scalable with decreasing dimensions.

A layered structure, including a SiGe seed layer, wherein the SiGe seed layer is monocrystalline and has about between 50% and 90% of Ge concentration, and a compressively strained Ge layer covering the SiGe seed layer, wherein the compressively strained Ge layer is monocrystalline and in epitaxial relation with the SiGe seed layer is disclosed.

A CMOS circuit, including a PMOS device hosted in a compressively strained Ge layer, wherein the compressively strained Ge layer is covering in epitaxial relation a SiGe seed layer, wherein the SiGe seed layer is monocrystalline and has about between 50% and 90% of Ge concentration is further disclosed.

A method for fabricating a PMOS device, including the steps of depositing epitaxially a monocrystalline SiGe seed layer having about between 50% and 90% of Ge concentration over a relaxed SiGe layer having about up to 50% of Ge concentration; depositing epitaxially a compressively strained Ge layer over the SiGe seed layer; and hosting the PMOS device in the compressively strained Ge layer is further disclosed.

A method for fabricating a CMOS circuit, including the steps of providing an SGOI wafer having a relaxed SiGe layer with about up to 50% of Ge concentration; using a shallow trench, or other, isolation technique to define NMOS and PMOS regions on the SGOI wafer; capping with a dielectric material the NMOS regions; depositing epitaxially and in a selective manner a monocrystalline SiGe seed layer having about between 50% and 90% of Ge concentration over the relaxed SiGe layer; depositing epitaxially and in a selective manner a compressively strained Ge layer over the SiGe seed layer; and hosting a PMOS device in the compressively strained Ge layer is further disclosed. The method for fabricating a CMOS circuit further including the step of depositing epitaxially and selectively a SiGe top layer over the compressively strained Ge layer, wherein the SiGe top layer is chosen to have about up to 10% of Ge concentration is further disclosed.

BRIEF DESCRIPTION OF THE DRAWINGS

These and other features of the present invention will become apparent from the accompanying detailed description and drawings, wherein.

DETAILED DESCRIPTION OF THE INVENTION

In the integration of strained Ge into advanced CMOS technology it is preferable to maintain the overall standard fabrication process of mainline Si CMOS as much as feasible. This invention integrates compressively strained Ge into such a process with changing/adding only a few steps out of the well over a hundred steps of typical advanced Si CMOS processing. In an exemplary embodiment the overall process flow of CMOS fabrication, including the strained Ge hosted PMOS, would follow these steps: Start with a silicon-on-insulator (SOI) or silicon-germanium-on-insulator (SGOI) wafer; go through the standard shallow trench isolation (STI) process, as known to one skilled in the art; cap NMOS region with a mask; open up Si or SiGe islands only in PMOS region; grow selectively Ge on top of exposed Si or SiGe surface; strip masking cap on NFET region; continue with the standard CMOS fabrication as known to one skilled in the art. This invention also teaches steps and structures which are novel outside the framework of CMOS fabrication process.

Figure 1:
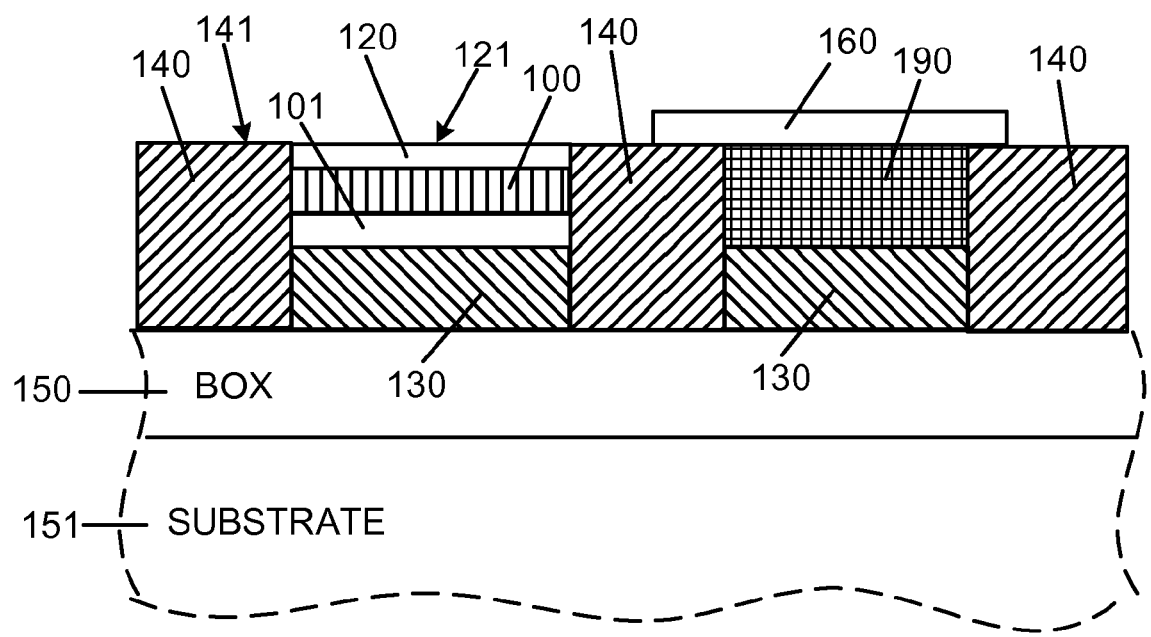
FIG. 1 shows a schematic cross sectional view of a layered structure used for fabricating devices.
Figure 2:
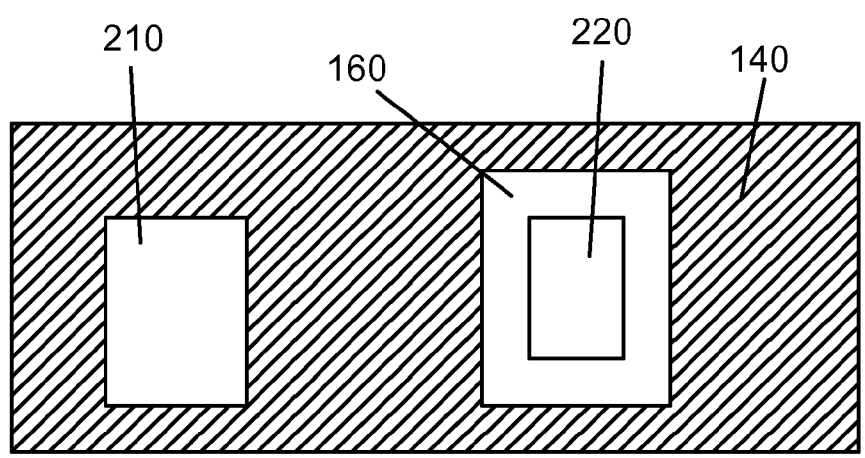
FIG. 2 shows a schematic top view of isolation and NMOS and PMOS regions.

FIG. 1 shows a schematic cross sectional view of a layered structure used for fabricating devices. FIG. 2 shows a schematic top view of isolation and NMOS and PMOS regions. In a representative embodiment the starting point is a SOI or SGOI wafer. A substrate 151, which is usually Si, has a so called buried oxide (BOX) 150 on over it, as known to one skilled in the art. On top of the BOX there is a relaxed monocrystalline SiGe layer 130 typically with about up to 50% of Ge concentration, with the possibility of being essentially pure Si. At the start this relaxed SiGe is a blanket layer on top of the BOX 150, but FIG. 1 shows a state of processing where an isolation dielectric 140 has already been applied and the relaxed SiGe layer 130 is fragmented. The isolation in an exemplary embodiment is so called shallow trench isolation (STI), but it could be of other various kinds as known to one skilled in the art. The isolation 140 separates, or defines, regions designated for PMOS devices 210 from regions designated for NMOS devices 220. Preferably the strained Ge layer introduced in this invention is used for the PMOS devices in the PMOS regions 210. The NMOS regions are handled in ways known to one skilled in the art, possibly with material layers 190 over the relaxed SiGe 130. Layer, or layers, 190 in the NMOS region are shown only symbolically, since layer 190 may not even exist at this stage of the process, or may never be implemented. The present invention uses methods known in the art in the processing of the NFET regions and devices. At this stage, as represented in the figures, the NMOS regions are covered with a mask 160. Mask 160 preferably is a dielectric, such as SiO$_2$, or nitride, or others, as known to one skilled in the art.

Introduction of the layers for the Ge hole-conduction type device, such as a PMOS, or P-MODFET, commences with depositing epitaxially a monocrystalline SiGe seed layer 101 having about between 50% and 90% of Ge concentration over the relaxed SiGe layer 130. Preferably the epitaxial growth of the SiGe seed layer 101 is done in a selective manner, and with a Ge concentration of around 70%. Selectivity in deposition is with regard to dielectric materials, such as the STI dielectric 140, or the NMOS mask 160. The Ge concentration in this SiGe seed layer 101 is not necessarily uniform, it can have various Ge concentration gradients depending on requirements of a specific embodiment. Non-uniform concentration typically serves the purpose of improving material quality. The preferred thickness range for this SiGe seed layer 101 is about between 0.3 nm and 3 nm. Some of the preference for this SiGe seed layer 101 is to improve the surface quality of the relaxed SiGe 130 of the SGOI wafer. The relatively high Ge concentration of the SiGe seed layer is an enabling aspect for the introduction of the compressively strained device quality Ge layer 100.

The compressively strained monocrystalline Ge layer 100 is deposited epitaxially over the SiGe seed layer 101. Preferably the epitaxial growth of the compressively strained Ge layer 100 is done in a selective manner. Selectivity in deposition is with regard to dielectric materials, such as the STI dielectric 140, or the NMOS mask 160. The preferred thickness range for this compressively strained Ge layer 100 is about between 5 nm and 20 nm. The Ge layer 100 is compressively strained because the relaxed lattice constant of Ge is larger than that of SiGe, and the epitaxial relationship through the layers forces the lattice of Ge layer 100 to comply with the layers underneath, all of which have smaller relaxed lattice constants than Ge. The compressively strained Ge layer is the one hosting a hole-type conduction device, such as a PMOS. The term of hosting a device in a certain material, or layer, means that the critical part of the device, that which is mainly sensitive to carrier properties, such as for instance, the channel of a MOS device, is residing in, composed of, housed in, in that certain material, or layer.

If one would prefer a surface channel PMOS device the material depositions could stop with the compressively strained Ge layer 100. For having a buried channel PMOS, as well as to preferably improve the interface qualities of the p-channel, a monocrystalline SiGe top layer 120 is epitaxially deposited covering the compressively strained Ge layer 100. The SiGe top layer 120 has about up to 10% of Ge concentration. In an exemplary embodiment this SiGe top layer is essentially pure Si, in which case a thickness of about between 0.3 nm and 10 nm is preferred. Preferably the epitaxial growth of the SiGe top layer 120 is done in a selective manner. Selectivity in deposition is with regard to dielectric materials, such as the STI dielectric 140, or the NMOS mask 160. Either the SiGe top layer 120, or the compressively strained Ge layer 100 is the last layer to be deposited, this layered structure has a well defined top surface 121. It is preferable for easy of processing that this surface 121 be coplanar with the top surface 141 of the isolating dielectric. However, lack of such coplanarity would not be a limiting factor.

The localized formation or growth of the buried Ge channel heterostucture within the selected confines of the PMOS regions entails using a selective CVD growth process whereby the growth of the device layers are selective to the known dielectric materials of SiO$_2$, Si$_3$N$_4$, SiON etc. Typical, or available selective growth processes for Si, SiGe and Ge films can be found in various growth techniques such as RT-CVD, UHV-CVD, LP-CVD, AP-CVD, etc. as known to one skilled in the art. In the preferred selective growth process of ultra-high-vacuum-chemical-vapor-deposition (UHV-CVD), the growth temperature for the SiGe seed layer 101 and the compressively strained Ge layer is the range of 250-350° C.

For a detailed description of the UHV-CVD technique for growing epitaxial layers, reference is made to U.S. Pat. No. 5,259,918 "Heteroepitaxial Growth of Germanium on Silicon by UHV/CVD" to S. Akbar et al, issued Nov. 9, 1993 assigned to the assignee herein and incorporated herein by reference. More UHV-CVD growth techniques are discussed in U.S. Pat. No. 6,350,993 B1 "High Speed Composite p-Channel Si/SiGe Heterostructure for Field Effect Devices" to J. O. Chu et al, issued on Feb. 26, 2003 assigned to the assignee herein and incorporated herein by reference. Epitaxial depositions for the layered structure of the SiGe seed layer 101, the compressively strained Ge layer 100, and the SiGe top layer 120 are done with ultrahigh vacuum integrity: in the range of about $10^{-9}$ Torr prior to the epitaxial deposition. In particular, a hot wall isothermal CVD apparatus is utilized whereby essentially no homogeneous gas phase pyrolysis of the silicon and/or germanium precursor such as silene ($SiH_4$) or germane ($GeH_4$) source gas occurs during the residence time, which is less than 1 second, within the selected temperature and pressure regime where the preferred growth process is operated. Typically, a batch of pre-patterned SGOI wafers are loaded in the UHV-CVD reactor and then heated in the range from 300° C. to 480° C. The growth pressure typically is in the in range from 1-5 millitorr. The SiGe seed layer 101 in a representative embodiment is grown over the SGOI region using a flow combination of $SiH_4$ at 25 sccm and of $GeH_4$ at 95 sccm. To grow the compressively strained Ge layer 100, the growth temperature is lowered close to 300° C. and then the $GeH_4$ is turned on at a flow of 50 sccm. After the completion of layer 100, the growth temperature is raised higher, and the $SiH_4$ is turned on at a flow of 30 sccm, and the $GeH_4$ is turned on at a flow of 0 to 15 sccm to form the thin SiGe top layer 120 over the compressively strained Ge layer 100. The thin top layer 120 in an exemplary embodiment is essentially pure Si.

Typically, but not necessarily, as known to one skilled in the art, selective CVD growth techniques prefer additional use of a chlorine based precursor or gas source, such as HCl, $Cl_2$, $SiCl_4$, $SiHCl_3$, $SiH_2Cl_2$ to induce the selective growth by removing any film growth over the standard masking materials.

Figure 3:
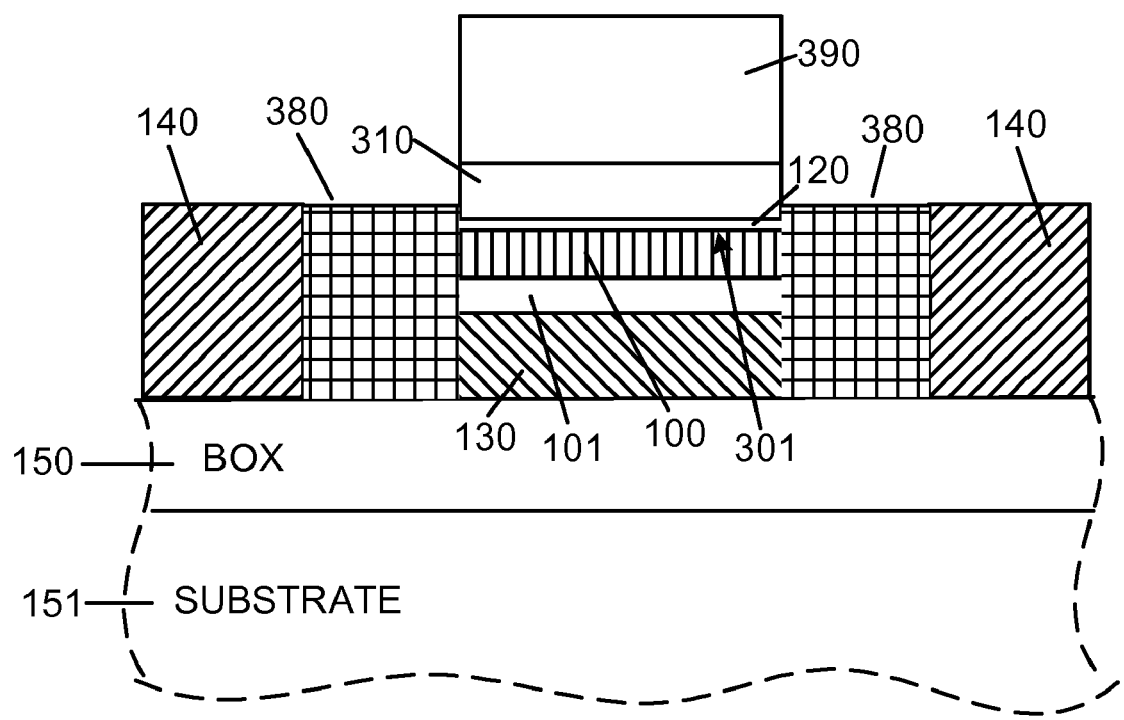
FIG. 3 shows a schematic cross sectional view of a buried channel PMOS device hosted in a compressively strained Ge layer.

FIG. 3 shows a schematic cross sectional view of a buried channel PMOS device hosted in a compressively strained Ge layer 100. Following the building up of the layered structure in FIG. 1, the device fabrication follows steps known to one skilled in the art. At one point source/drain junctions 380 are being created. The source/drain 380 as shown in the figure extend downward touching the BOX layer 150. This is only an illustration, in an exemplary embodiment the source/drain 380 may, or may not, reach down to the BOX layer interface 150, or may even happen that it penetrates into the BOX layer 150. At another point in the process a gate insulator 310 is employed. Preferred gate insulators are, but not limited to, a deposited oxide, typically by a plasma low temperature process, and so called high-K (high dielectric) materials, such as $HfO_2$, HfSiO, and others known to one skilled in the art. Similarly, a large variety of materials can be employed for the gate 390, as known to one skilled in the art. In further fabrication of the devices, such as during processing of the gate insulator 310, one may, or may not, consume from the Si/SiGe top layer 120. For illustration, the figure shows schematically a slight consumption of layer 120. Holes are conducted in a channel on the top surface 301 of the compressively strained Ge layer 100, which is the interface with the Si or SiGe top layer 120. The channel forms here due to the well known bandgap alignment between Ge and Si.

Figure 4:
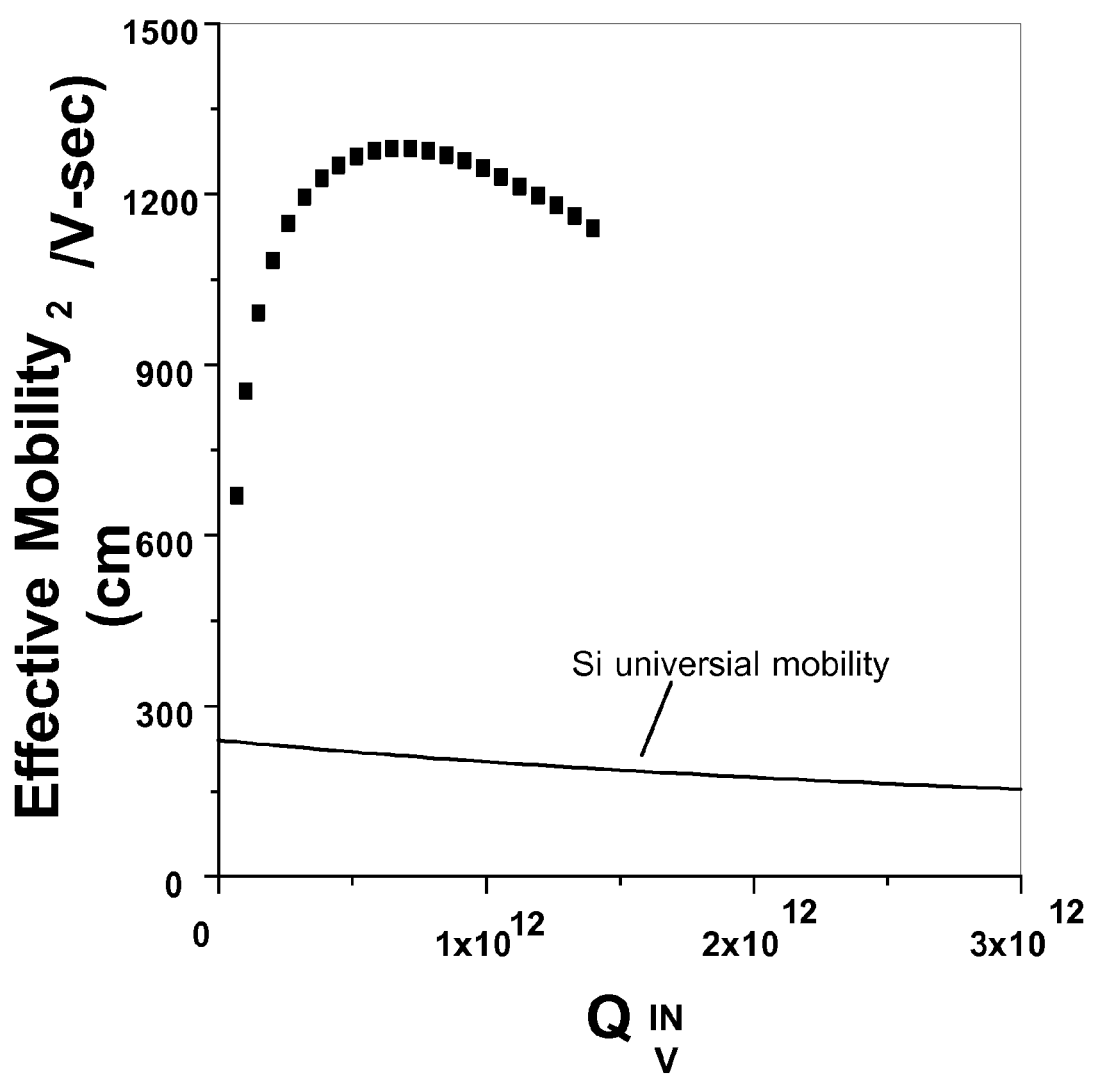
FIG. 4 shows a plot of measured mobility values for a buried channel PMOS device hosted in a compressively strained Ge layer.

FIG. 4 shows a plot of measured mobility values for a buried channel PMOS device hosted in a compressively strained Ge layer as function of inversion charge. The maximum hole mobility in the disclosed device is over six times the Si universal hole mobility, which is also shown for comparison.

Figure 5:
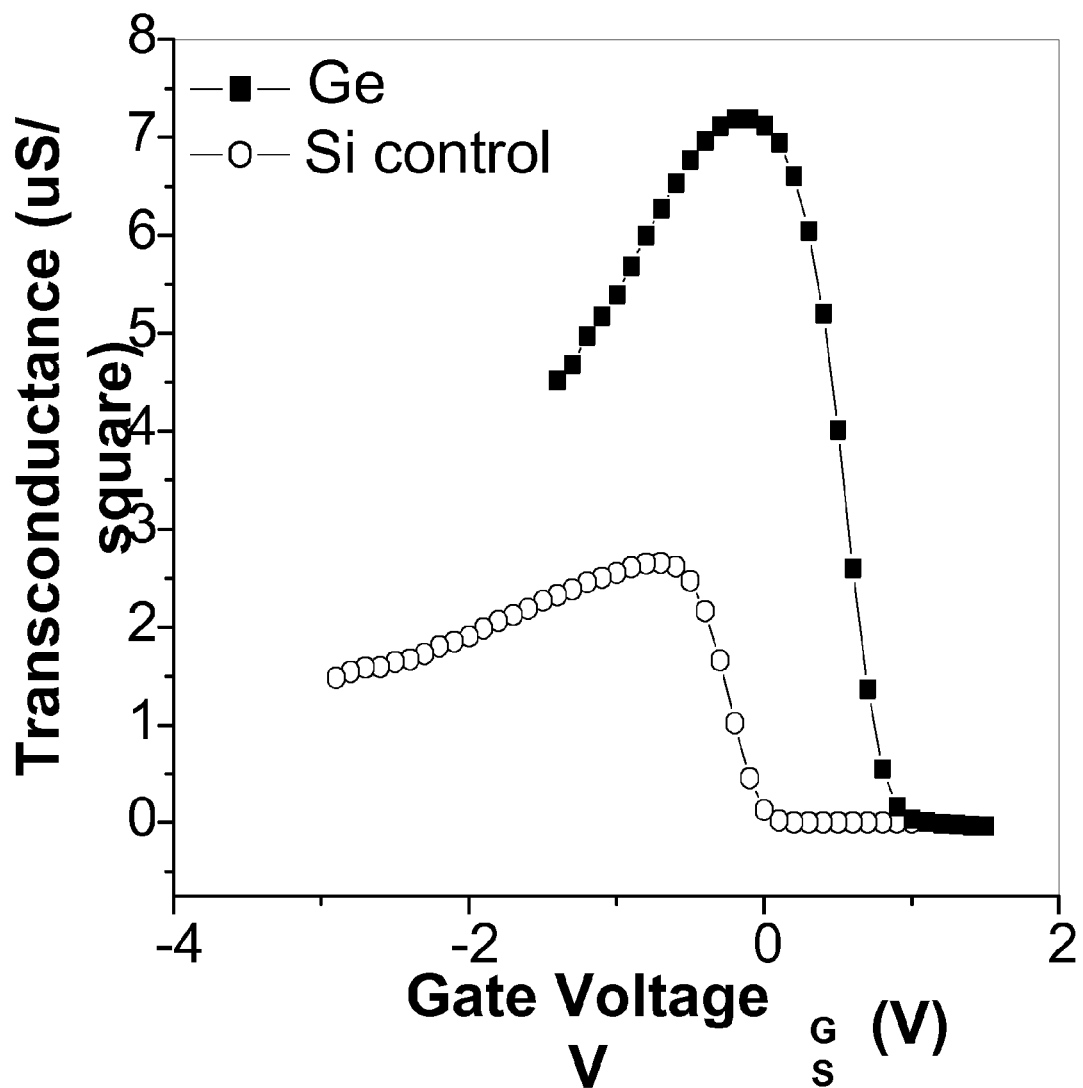
FIG. 5 shows a plot of measured transconductance values for a buried channel PMOS device hosted in a compressively strained Ge layer.

FIG. 5 shows a plot of measured transconductance values for a buried channel PMOS device hosted in a compressively strained Ge layer. The displayed characteristics is from a device with a deposited oxide gate insulator. As shown, the transconductance of the disclosed device is enhanced over that of a Si device by over a factor of two.

Figure 6:
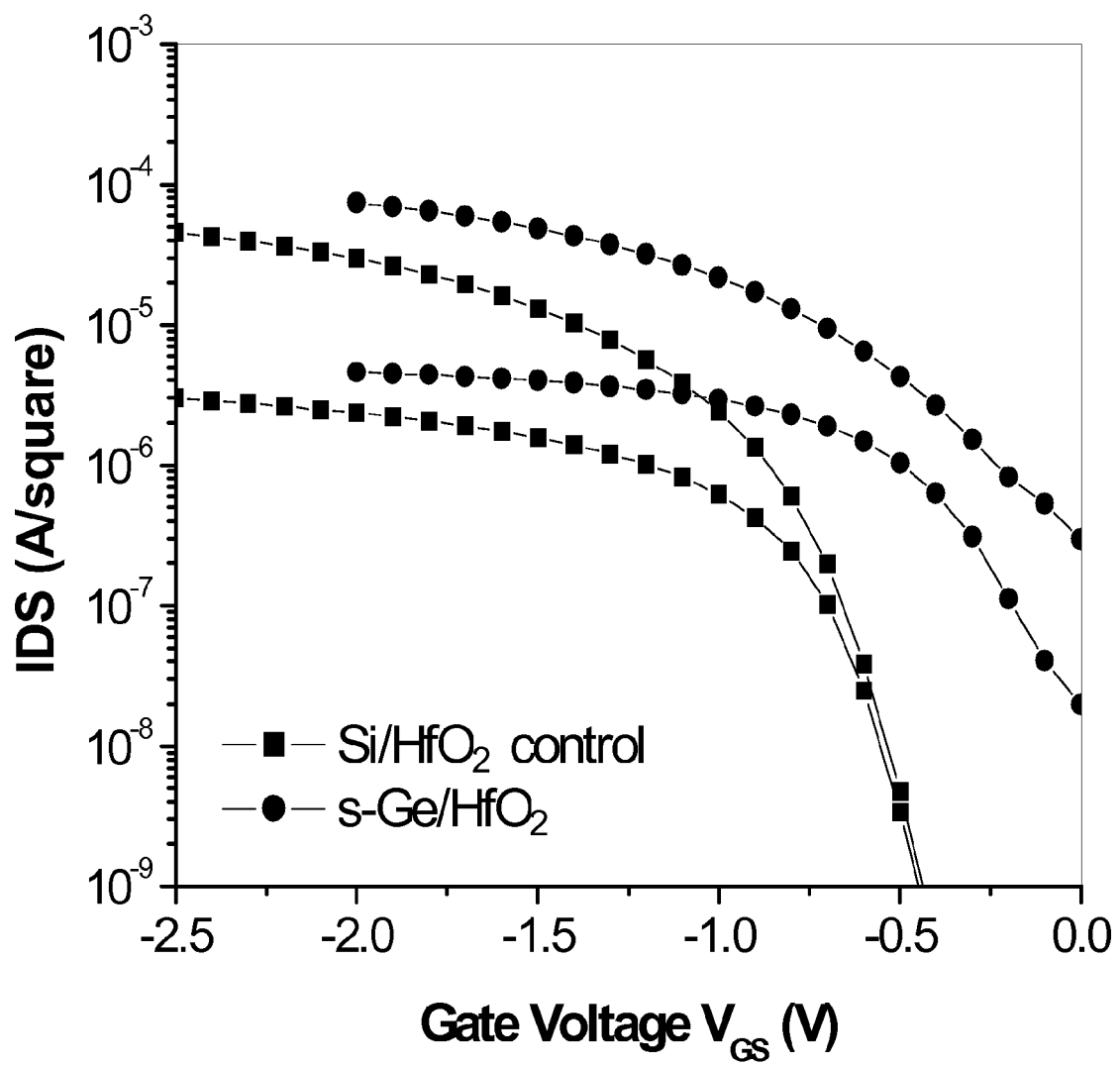
FIG. 6 shows a measured conduction plot for a buried channel PMOS device hosted in a compressively strained Ge layer.

FIG. 6 shows a measured conduction plot for a buried channel PMOS device hosted in a compressively strained Ge layer. Subthreshold and conduction characteristics of buried channel PMOS with high-K, specifically $HfO_2$ gate insulator are shown for low and high drain voltage. A Si control device with the same $HfO_2$ as gate insulator is shown for comparison. The s-Ge (strained-Ge) device shows over two times enhancement in drive current.

Many modifications and variations of the present invention are possible in light of the above teachings, and could be apparent for those skilled in the art. The scope of the invention is defined by the appended claims.

We claim:

1. A method for fabricating a PMOS device, comprising:
   depositing epitaxially a monocrystalline SiGe seed layer directly onto a relaxed SiGe layer, wherein said SiGe seed layer has between about 50% and 90% of Ge concentration and a thickness of between about 0.3 nm and about 3 nm, wherein said relaxed SiGe layer has up to about 50% of Ge concentration;
   depositing epitaxially a monocrystalline compressively strained Ge layer directly onto said SiGe seed layer, wherein said compressively strained Ge layer has a thickness of between about 5 nm and about 20 nm;
   depositing epitaxially a monocrystalline Si top layer directly onto said compressively strained Ge layer, wherein said Si top layer has a thickness of between about 0.3 nm and about 4 nm;
   executing said epitaxial depositions of said SiGe seed layer, said compressively strained Ge layer, and said Si top layer, in such manner as to be selective in regard to dielectric materials;
   hosting a p-channel in said compressively strained Ge layer, wherein said PMOS device comprises said p-channel; and
   using a high-K material in a gate insulator, wherein said PMOS device comprises said gate insulator.

* * * * *